United States Patent
Katou et al.

(10) Patent No.: US 8,951,638 B2
(45) Date of Patent: Feb. 10, 2015

(54) SILICON CARBIDE POWDER FOR PRODUCING SILICON CARBIDE SINGLE CRYSTAL AND A METHOD FOR PRODUCING THE SAME

(71) Applicants: National Institute of Advanced Industrial Science and Technology, Chiyoda-ku, Tokyo (JP); Denki Kagaku Kogyo Kabushiki Kaisha, Chuo-ku, Tokyo (JP)

(72) Inventors: Tomohisa Katou, Tsukuba (JP); Yusuke Takeda, Machida (JP); Hiroshi Murata, Machida (JP)

(73) Assignees: Denki Kagaku Kogyo Kabushiki Kaisha, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/894,533

(22) Filed: May 15, 2013

(65) Prior Publication Data

US 2013/0266810 A1    Oct. 10, 2013

Related U.S. Application Data

(63) Continuation of application No. PCT/JP2011/075930, filed on Nov. 10, 2011.

(30) Foreign Application Priority Data

Nov. 15, 2010 (JP) ................................ 2010-254378

(51) Int. Cl.
    *B32B 5/16* (2006.01)
(52) U.S. Cl.
    USPC ............. 428/402; 423/345; 423/346; 501/88; 501/89; 501/90; 501/91; 264/676; 264/682
(58) Field of Classification Search
    USPC ............... 428/402; 423/345, 346; 501/88–91; 264/676, 682
    IPC .................................. C01B 31/36; C30B 29/36
    See application file for complete search history.

(56) References Cited

U.S. PATENT DOCUMENTS

| 4,529,575 | A | * | 7/1985 | Enomoto et al. | ............... 423/345 |
| 4,832,929 | A | * | 5/1989 | Saiki et al. | ................... 423/346 |
| 4,847,060 | A | * | 7/1989 | Saiki et al. | ................... 423/346 |
| 4,869,886 | A | * | 9/1989 | Saiki et al. | ................... 423/346 |
| 5,863,325 | A | | 1/1999 | Kanemoto et al. | |

FOREIGN PATENT DOCUMENTS

| CN | 101746758 | A | | 6/2010 |
| JP | H0354111 | A | | 3/1991 |
| JP | H04270105 | A | | 9/1992 |
| JP | H0948605 | A | | 2/1997 |
| JP | 2005-239496 | A | | 9/2005 |
| JP | 2009-173501 | | * | 8/2009 |
| JP | 2009-173501 | A | | 8/2009 |
| JP | 2009173501 | A | | 8/2009 |

OTHER PUBLICATIONS

International Search Report of PCT/JP2011/075930 mailed Feb. 21, 2012.
Yu.M. Tairov and V.F. Tsvetkov, "General Principles of Growing Large-Size Single Crystals of Various Silicon Carbide Polytypes", Journal of Crystal Growth, 1981, vol. 52, pp. 146-150.
Japanese Office Action for application No. 2010-254378 dated Oct. 7, 2014.
Chinese Office Action for application No. 201180055027.5 dated Oct. 22, 2014

* cited by examiner

*Primary Examiner* — Leszek Kiliman
(74) *Attorney, Agent, or Firm* — Lowe Hauptman & Ham, LLP

(57) ABSTRACT

A silicon carbide powder for the production of a silicon carbide single crystal has an average particle diameter of 100 μm or more and 700 μm or less and a specific surface area of 0.05 m²/g or more and 0.30 m²/g or less. A method for producing a silicon carbide powder for the production of the silicon carbide single crystal including sintering a silicon carbide powder having an average particle diameter of 20 μm or less under pressure of 70 MPa or less at a temperature of 1900° C. or more and 2400° C. or less and in a non-oxidizing atmosphere, thereby obtaining a sintered body having a density of 1.29 g/cm³ or more; adjusting particle size by means of pulverization of the sintered body; and removing impurities by means of an acid treatment.

5 Claims, 4 Drawing Sheets

FIG. 1

| | Raw Material | | | Sintering conditions | | Sintering characteristics | | Powder characteristics (crushed) | | | |
|---|---|---|---|---|---|---|---|---|---|---|---|
| | average Particle Diameter (μm) | Crystal phase | Sintered Auxiliary agent | Temp (°C) | Pressure (MPa) | Absolute Density (%) | 300~500μm yield (%) | average Particle Diameter (μm) | Specific Surface Area (m²/g) | Particle diameter of Primary Particles (μm) | Impurities |
| Example 1 | 6.0 | β | none | 2200 | 20 | 62.7 | 82 | 449.7 | 0.15 | 20~180 | ≤1 ppm |
| Example 2 | 0.5 | α | none | 2000 | 30 | 60.5 | 84 | 457.5 | 0.16 | 10~40 | ≤1 ppm |
| Example 3 | 0.03 | β | none | 2200 | 20 | 42.4 | 24 | 375.3 | 0.15 | 15~150 | ≤1 ppm |
| Example 4 | 6.0 | β | none | 2200 | 5 | 45.1 | 28 | 398.2 | 0.18 | 15~150 | ≤1 ppm |
| Comparative Example 1 | 58.5 | β | none | 2200 | 20 | Not sintered | — | — | — | — | — |
| Comparative Example 2 | 6.0 | β | none | 1700 | 20 | Not sintered | — | — | — | — | — |
| Comparative Example 3 | 6.0 | β | none | 2450 | 20 | Raw material sublimed | — | — | — | — | — |
| Comparative Example 4 | 0.5 | α | B₄C | 2000 | 30 | 99.6 | 75 | 482.1 | 0.01 ≤ (undetectable) | 3~15 | B:3400ppm |

FIG. 2

| | Synthesis of a Raw Material Silicon Carbide | | | | Synthesis of Silicon Carbide Powder | | | | | | |
|---|---|---|---|---|---|---|---|---|---|---|---|
| | Synthesis Conditions | | Raw Material Silicon Carbide | | Synthesis Conditions | Separation Process | Characteristics of the obtained silicon carbide powder | | | | |
| | Heating Temp (°C) | Number of times Each process | Average Particle Diameter (µm) | Added Amounts (% by mass) | Heating Temp (°C) | 125µm yield (%) | Average Particle Diameter (µm) | Specific Surface Area (m²/g) | Particle diameter of Primary particles (µm) | Impurities |
| Example 5 | 2000 | 2 | 44.8 | 10 | 2000 | 88 | 163.2 | 0.26 | 10~40 | ≤1 ppm |
| Example 6 | 2100 | 1 | 72.6 | 15 | 2100 | 94 | 232.1 | 0.22 | 20~60 | ≤1 ppm |
| Example 7 | 2000 | 2 | 39.2 | 40 | 2000 | 80 | 142.1 | 0.25 | 8~40 | ≤1 ppm |
| Example 8 | 2000 | 4 | 325.2 | 10 | 2000 | 93 | 389.5 | 0.18 | 20~80 | ≤1 ppm |
| Comparative Example 5 | — | — | — | 0 | 2000 | 0 | 23.4 | 0.61 | 3~15 | ≤1 ppm |
| Comparative Example 6 | 2000 | 2 | 34.8 | 80 | 2000 | 0 | 56.3 | 0.48 | 8~25 | ≤1 ppm |
| Comparative Example 7 | 2000 | 1 | 6.0 | 10 | 2000 | 0 | 34.1 | 0.54 | 5~20 | ≤1 ppm |
| Comparative Example 8 | 1700 | 3 | 21.8 | 10 | 1700 | 0 | 33.4 | 0.46 | 1~5 | ≤1 ppm |

FIG. 3

| | Silicon carbide production process | | | | | | Post-processing | | | | |
|---|---|---|---|---|---|---|---|---|---|---|---|
| | Raw Material | | Sintering conditions | | Characteristics of the obtained silicon carbide powder | | Sintering Conditions | Characteristics of the obtained silicon carbide powder | | | |
| | Metal Si Average Particle Diameter (μm) | Carbon Source | Temp (°C) | Time (hr) | Average Particle Diameter (μm) | | Temp (°C) | Average Particle Diameter (μm) | Specific Surface Area (m²/g) | Particle diameter Of Primary particles (μm) | Impurities |
| Example 9 | 308.2 | Phenol Resin | 1400 | 10 | 289.4 | | 2000 | 284.1 | 0.21 | 8~50 | ≤ 1 ppm |
| Example 10 | 124.2 | Phenol Resin | 1350 | 6 | 113.8 | | 1900 | 110.5 | 0.29 | 8~30 | ≤ 1 ppm |
| Comparative Example 9 | 1.0 | Phenol Resin | 1400 | 10 | 1.1 | | 2000 | 25.8 | 0.62 | 3~15 | ≤ 1 ppm |
| Comparative Example 10 | 1000 | Phenol Resin | 1400 | 30 | Silicon Remained | | — | — | — | — | — |
| Comparative Example 11 | 308.2 | Phenol Resin | 1200 | 30 | Not Reacted | | — | — | — | — | — |
| Comparative Example 12 | 308.2 | Phenol Resin | 1600 | 10 | 4.2 | | 2000 | 26.2 | 0.59 | 3~15 | ≤ 1 ppm |
| Comparative Example 13 | 308.2 | Phenol Resin | 1400 | 10 | 289.4 | | 1500 | 182.1 | 0.31 | 0.5~3 | ≤ 1 ppm |
| Comparative Example 14 | 308.2 | Carbon Black | 1400 | 10 | 0.4 | | 2000 | 24.7 | 0.60 | 3~15 | ≤ 1 ppm |

FIG. 4

| | Characteristics of Raw Material Powder | | Sublimation rate after 2 hours (mg/hr) | Sublimation rate after 20 hours (mg/hr) | Length of the single crystal after 20 hours (mm) |
|---|---|---|---|---|---|
| | Average Particle Diameter (μm) | Specific Surface Area (m²/g) | | | |
| Example 11 | 449.7 | 0.15 | 50 | 51 | 5.5 |
| Example 12 | 457.5 | 0.16 | 48 | 50 | 5.6 |
| Example 13 | 163.2 | 0.26 | 72 | 70 | 7.0 |
| Example 14 | 232.1 | 0.22 | 59 | 56 | 6.1 |
| Example 15 | 284.1 | 0.21 | 56 | 55 | 6.0 |
| Example 16 | 110.5 | 0.29 | 70 | 67 | 6.6 |
| Comparative Example 15 | 682.9 | ≤ 0.01 (undetectable) | 24 | 25 | 2.3 |
| Comparative Example 16 | 2350 | ≤ 0.01 (undetectable) | 3 | 2 | ≤ 1 |
| Comparative Example 17 | 0.5 | 16.1 | 68 | 31 | 3.2 |
| Comparative Example 18 | 23.4 | 0.42 | 78 | 34 | 3.4 |
| Comparative Example 19 | 56.3 | 0.34 | 71 | 37 | 4.1 |
| Comparative Example 20 | 25.8 | 0.40 | 81 | 32 | 3.5 |

SILICON CARBIDE POWDER FOR PRODUCING SILICON CARBIDE SINGLE CRYSTAL AND A METHOD FOR PRODUCING THE SAME

CROSS REFERENCE TO RELATED APPLICATIONS

This application is based upon and claims the benefit of priority from the prior Japanese Patent Application No. 2010-254378, filed on Nov. 15, 2010 and PCT International Application PCT/JP2011/075930, filed on Nov. 10, 2011, the entire contents of which are incorporated herein by reference.

FIELD

The present invention is related to a silicon carbide powder for producing silicon carbide single crystal and a method for producing the silicon carbide powder.

BACKGROUND

Conventionally, a sublimation recrystallization method (Modified Lely Method) in which silicon carbide powder which is a raw material is sublimed under high temperature conditions of 2000° C. or more and a single crystal is grown on a silicon carbide seed crystal is known as a method of producing silicon carbide powder single crystal (Yu. M Tairov and V. F. Tsvetkov, Journal of Crystal Growth vol. 52 (1981) pp. 146-150).

In addition, it is also known that many crystal defects are produced by mixing impurities within a single crystal in the case where silicon carbide powder including a large amount of impurities is used in a sublimation recrystallization method.

The Acheson process and chemical vapor deposition method are known as methods of producing silicon carbide powder. However, there is a problem of impurities when the silicon carbide powder is obtained using the Acheson method and low productivity when the silicon carbide powder is obtained using a chemical vapor deposition method.

In addition, a method of producing silicon carbide powder for producing silicon carbide single crystal is disclosed (patent document 1) in which a mixed product of a liquid shaped silicon compound and an organic compound which produces carbon by heating is heated and reacted and the contained amount of each impurity element is 0.5 ppm or less.

In addition, silicon carbide powder for producing silicon carbide single crystal is required to have a relatively large average particle diameter in order to maintain a stable sublimation rate under a single crystal growth condition. For example, an average particle diameter of 10~500 µm is disclosed in Japanese Laid Open Patent H9-48605.

SUMMARY

The present invention provides a silicon carbide powder which displays a high and stable sublimation rate during single crystal growth by means of a sublimation recrystallization method; and a method for producing the silicon carbide powder.

The present invention adopts the following means in order to solve the problems described above.

(1) A silicon carbide powder for producing a silicon carbide single crystal including an average particle diameter of 100 µm or more and 700 µm or less and a specific surface area of 0.05 m²/g or more and 0.30 m²/g or less.

(2) The silicon carbide powder for producing a silicon carbide single crystal according to (1) wherein primary particles having an average particle diameter of 5 µm or more and 200 µm or less are sintered.

(3) A method for producing a silicon carbide powder for the production of the silicon carbide single crystal according to (1) further including sintering a silicon carbide powder having an average particle diameter of 20 µm or less under pressure of 70 MPa or less at a temperature of 1900° C. or more and 2400° C. or less and in a non-oxidizing atmosphere, thereby obtaining a sintered body having a density of 1.29 g/cm³ or more; adjusting particle size by means of pulverization of the sintered body; and removing impurities by means of an acid treatment.

(4) The method for producing a silicon carbide powder for the production of a silicon carbide single crystal according to (1) wherein the silicon carbide powder is obtained by heating and sintering a raw material mixed product at a temperature of 1800° C. or more and 2300° C. or less under a non-oxidizing atmosphere condition using 5% by mass or more and 50% by mass or less of a silicon carbide powder with average particle diameter of 20 µm or more with a silicon source and a carbon source average particle diameter of 20 µm or more.

(5) The method for producing a silicon carbide powder for the production of a silicon carbide single crystal according to (1) further including producing the silicon carbide powder by heating and sintering metal silicon and a carbon source with an average particle diameter of 100 µm or more and 700 µm or less under a non-oxidizing atmosphere condition at a temperature of 1300° C. or more and 1400° C. or less; and post-processing the silicon carbide powder by heating at a temperature of 1800° C. or more and 2300° C. or less under a non-oxidizing atmosphere condition.

(6) The method for producing a silicon carbide powder for the production of a silicon carbide single crystal according to (5) wherein the carbon source is an organic compound and the organic compound is carbonized by heating at a temperature of 500° C. or more and 1000° C. or less under a non-oxidizing atmosphere condition before producing the silicon carbide powder heating and sintering.

BRIEF DESCRIPTION OF THE DRAWINGS

FIG. 1 shows the characteristics of a silicon carbide powder related to one example of the present invention;

FIG. 2 shows the characteristics of a silicon carbide powder related to one embodiment of the present invention;

FIG. 3 shows the characteristics of a silicon carbide powder related to one embodiment of the present invention; and FIG. 4 shows the growth of a silicon carbide single crystal related to one embodiment of the present invention.

DESCRIPTION OF EMBODIMENTS

A high and stable sublimation rate is demanded as a characteristic of a silicon carbide powder for producing a silicon carbide single crystal. For the reasons described above, the silicon carbide powder of the present invention has an average particle diameter of 100 µm or more and 700 µm or less and a specific surface area of 0.05 m²/g or more and 0.30 m²/g or less. In the case where the average particle diameter is less than 100 µm or the specific surface area exceeds 0.30 m²/g, the sublimation rate (2000° C. or more and 2500° C. or less) when producing a silicon carbide single crystal is high during the sublimation initial stage. However, the specific surface area decreases as sintering of the silicon carbide powder gradually progresses and the sublimation rate drops. On the other hand, in the case where the average particle diameter exceeds 700 μm or the specific surface area is less than 0.05 m²/g, the specific surface area of the silicon carbide itself decreases and this reduces the sublimation rate which is not desirable.

In addition, the silicon carbide powder of the present invention has a particle state in which pairs of primary particles with particle diameter of 5 μm or more and 200 μm or less are sintered. If the primary particle diameter of the silicon carbide powder is less than 5 μm or exceeds 200 μm, the strength of the silicon carbide powder decreases and it is not possible to maintain the particle state when handling which is not desirable.

Furthermore, because the silicon carbide powder of the present invention has a contained amount of each impurity of 1 ppm or less, crystal defects are few and it is possible to use the silicon carbide powder as a raw material of a silicon carbide single crystal with excellent conductivity control. Here, an impurity element is an element belongs to group 1 to group 16 and in the periodic table of the 1989 IUPAC Inorganic Chemical Nomenclature Revised Edition and has an atomic number of three or more except atomic numbers 6~8 and 14. In the present invention, the contained amount of Li, B, Na, Mg, Al, P, K, Ca, Ti, V, Cr, Mn, Fe, Co, Ni, Cu, Zn, Zr, Mo, Pd, Cd, Sb, Ba and W is measured.

A number of producing methods of the silicon carbide powder of the present invention are exemplified.
(Sintered Powder Crushing Method)

A producing method wherein a silicon carbide sintered body is produced by sintering the silicon carbide powder, the particle size is adjusted by crushing the obtained silicon carbide sintered body and impurities mixed in during the crushing process are removed using an acid treatment can be given as an example of a first producing method of the silicon carbide powder of the present invention. This is described in detail below.

Either an α type silicon carbide or β type silicon carbide can be used as the silicon carbide used in the sintered body creation process. High grade purification is easy if a high purity silicon carbide powder is used and reducing the contained amount of each impurity to a few ppm of less is preferred. An average particle diameter of 20 μm or less is preferred and 10 μm is desirable considering sintering performance. When average particle diameter exceeds 20 μm, the contact area between adjacent powder particles decreases and sintering becomes insufficient. In addition, because the surface amount of oxygen increases when the particle diameter is small causing a decrease in sintering performance, the lower limit value of particle diameter is preferred to be 0.1 μm or more and more preferably 0.4 μm or more.

In addition, in a conventional producing method, a metal auxiliary agent is added in the sintering of the silicon carbide with the aim of densification. However, in the present invention, it is preferred that the silicon carbide is sintered without using a metal auxiliary agent from the view point of reducing impurities.

The above described silicon carbide powder is filled into a metal mold and a compact body is created. The compact metal mold which is used here is preferred to be a metal mold having a part or all of the mold being graphite so that the compact and the metal sections of the metal mold do not contact considering the purity of the sintered body to be obtained. The compact which is obtained is pressure sintered under a non-oxidizing atmosphere and a sintered body is created. A hot press sintering method is available as the pressure sintering method.

In a hot press sintering method the sintering temperature is 1900° C. or more and 2400° C. or less and more preferably 2000° C. or more and 2200° C. or less. If the sintering temperature is less than 1900° C., the density of the sintered body is insufficient and if the sintering temperature exceeds 2400° C., the silicon carbide raw material begins to sublime which is not desirable. The applied pressure is 70 MPa or less. In the case where no pressure is applied or the applied pressure is low, the density of the sintered body to be obtained is low and therefore an applied pressure of 10 MPa or more is preferred. In addition, if the applied pressure exceeds 70 MPa, the hot press fixtures such as a dice or punch etc can become damaged which is not desirable considering producing efficiency.

The heating time during the sintering process is selected from a time period according to type of silicon carbide powder which is filled or the density of the sintered body to be obtained and a maximum temperature is preferred to be maintained in a range of 1 hour or more and 4 hours or less.

The obtained silicon carbide sintered body is crushed using a crusher such as a hammer mill, a bantam mill or a jaw crusher for example and a silicon carbide powder with an average particle diameter of 100 μm or more and 700 μm or less is obtained by separation using a sieve. It is possible to use acid cleaning such as hydrochloric acid or hydrofluoric acid or a mixed acid of hydrofluoric acid and nitric acid to remove the impurities that are mixed in during the crushing process.

The density of the silicon carbide sintering is 1.29 g/cm³ (relative density 40%) or more. Here, relative density is a value calculated with a theoretical density of 3.22 g/cm³ given as 100%. If the relative density exceeds 40%, mechanical strength of the sintered body decreases, the occurrence of fine particles in the following crushing process increases and productivity decreases which is not desirable. In addition, although it is possible to use a densified sintered body, in the case where a porous sintered body (relative density of 40% or more) with a low density is crushed, it is possible to obtain a powder with a higher specific surface area. From this view point, the relative density of the sintered body of the present invention is preferred to be 60% or more and 80% or less.
(Nucleus Addition Method)

A method of heating and sintering a source material mixed product of silicon carbide powder used as the silicon source and carbon source can be given as an example of a second producing method of the silicon carbide powder of the present invention. This is explained in detail below.

Metal silicon, silicon nitride, silicon oxide, liquid shaped silicon compound (for example, tetraalkoxysilane or its polymer) and graphite powder, carbon black, or an organic compound with remaining carbon due to heating (for example, phenol resin or fran resin) are available as the as the silicon and carbon sources for producing a silicon carbide powder. Metal silicon/carbon black, silicon nitride/carbon black are preferred as a combination of raw materials considering handling and purity of the silicon carbide powder after heating and sintering.

In the case of using metal silicon/carbon black, silicon nitride/carbon black, the mol ratio (C/Si ratio) of the silicon and carbon source is preferred to be 0.8 or more and 1.5 or less and more preferably 0.9 or more and 1.1 or less. When the C/Si ratio is less than 0.8, non-reacted Si often remains and when the C/Si ratio exceeds 1.5, non-reacted C often remains and a removal process is required.

Silicon carbide powder used as a raw material is preferred to have an average particle diameter of 20 μm or more. In addition, silicon carbide powder of a source material mixed product is preferred to be 5% by mass or more and 50% by mass or less. A source material mixed product is heated and sintered under a non-oxidizing atmosphere.

The silicon carbide powder used as a raw material selectively becomes the start point for particle formation when heated and sintered and large secondary particles are formed when sintering is promoted. In the case where average particle diameter of the silicon carbide to be added is less than 20 μm, the particle diameter of the silicon carbide powder which is obtained by sintering decreases which is not desirable. Although there is not upper limit to the average particle diameter of the silicon carbide to be added, because coarsening effects due to particle growth and sintering are not significantly shown when the particle diameter is too large, the average particle diameter is preferred to be 200 μm or less.

While α silicon carbide or β silicon carbide can be used as the silicon carbide powder used as a raw material, because β silicon carbide is produced in the producing method of the present invention, the use of β silicon carbide powder is preferred. Furthermore, using β silicon carbide powder producing from the same raw material as the silicon source and carbon source used to produce the silicon carbide powder is more preferable.

The silicon carbide powder used as a raw material within a raw material mixed product is preferred to be 5% by mass or more and 50% by mass or less. In the case where the silicon carbide powder is less than 5% by mass, formation and particle growth of the silicon carbide particles occurs anew in parts other than the silicon carbide powder, sintering progresses and secondary particles do not achieve a sufficient particle diameter, and when the silicon carbide powder is more than 50% by mass, the starting points of particle growth increase and particle growth effects decrease which is not desirable.

In the present invention, a source material mixed product added with silicon carbide powder is preferred to be heated and sintered at a temperature of 1800° C. or more and 2300° C. or less and more preferably 1900° C. or more and 2100° C. or less. If the heating temperature is less than 1800° C., particle growth and sintering of particle pairs are insufficient and when the heating temperature exceeds 2300° C., sublimation of the silicon carbide which is produced begins which is not desirable.

In addition, although the heating time during heating and sintering is selected from a time range so that non-reactive objects do not exist and where particle growth and sintering of particle pairs progresses, the time period at a maximum temperature is preferred to be maintained in a range of 1~10 hours.

By performing a separation process of the silicon carbide powder which is obtained by the method described above using a sieve for example, a silicon carbide powder with an average particle diameter of 100 μm or more and 700 μm or less is obtained. Furthermore, by repeating the above described process a further one time or more using the silicon carbide powder which is obtained, it is possible to obtained a coarser silicon carbide powder.

(Solid-Phase Reaction Method)

Uniformly covering an organic compound with remaining carbon which becomes a carbon source due to heating, on a metal silicon which is a silicon source, heating and sintering at a metal silicon melting point temperature (1410° C.) or less under a non-oxidizing atmosphere to obtain a silicon carbide powder and heating the obtained silicon carbide powder at a higher temperature than that described above under a non-oxidizing atmosphere is an example of a third producing method of the silicon carbide powder of the present invention. This is described in detail below.

Considering the purity of the silicon carbide powder after heating and sintering, the metal silicon used as a raw material is preferred to have a high grade purity and the contained amount of each impurity is preferred to be reduced to a few ppm or less. In addition, considering the particle diameter of the silicon carbide powder which is produced as a result of heating and sintering, the particle diameter of the metal silicon is preferred to be 100 μm or more and 700 μm or less. In addition, in the case of using a metal silicon having a particle diameter which exceeds 700 μm, a sintering reaction does not proceed efficiently, non-reacted metal silicon still remains and the reaction rate drops. When the particle diameter is less than 100 μm, a silicon carbide powder with an average particle diameter of 100 μm or more and 700 μm or less and a specific surface area of 0.05 $m^2/g$ or more and 0.30 $m^2/g$ or less cannot be obtained which is not desirable.

While organic compounds with residual carbon due to heating are available to be used as the carbon source, it is also possible to use resins such as a phenol resin, fran resin, epoxy resin and xylene resin etc. While a liquid shaped material at normal temperature or a softening or liquid shaped material due to heating such as thermoplasticity or thermal melting are mainly used, among these a resol type phenol resin is favorable considering the purpose of covering a metal silicon.

When uniformly mixing a metal silicon and carbon source, a solid material formed by curing a mixed product of the metal silicon and carbon source is preferred. For example, in the case where a liquid shaped carbon source is used, a mixed product of the metal silicon and carbon source is cured and following this the silicon carbide is sintered. Examples of the curing method are a cross linking method by heating and a curing method by a curing catalyst. In the case where the carbon source is a phenol resin, acids such as toluenesulfonic acid, maleic acid, maleic acid anhydride and hydrochloric acid can be used as a curing catalyst.

In the producing method of the present invention, it is preferred that a carbonizing process is performed for heating a mixed product of a metal silicon and carbon source in advance under a non-oxidizing atmosphere. When a heating carbonizing process is performed, it is possible to select a heating temperature according to the type of organic compound of the carbon source. However, a heating temperature of 500° C. or more and 1000° C. or less is preferred. In addition, a heating time of 30 minutes or more and 2 hours or less is preferred. If the heating time is less than 30 minutes, the carbonizing process is insufficient and improvements in the effects of the invention are not observed if heating is performed for over 2 hours. In addition, it is possible to use nitrogen or argon etc in the on-oxidizing atmosphere.

In the producing, method of the present invention, the mole ratio (C/Si) between silicon and carbon source of a mixed product of a metal silicon and carbon source is defined by a carbon product intermediate obtained by carbonizing from the raw material mixed product and its value is preferred to be 0.8 or more and 1.5 or less and more preferably 0.9 or more and 1.1 or less. In the case where the C/Si is less than 0.8, non-reacted Si remains and the reaction rate decreases and in the case where the C/Si exceeds 1.5, a large amount of non-reacted C remains and a removal process becomes necessary which is not desirable.

Silicon carbide powder is produced by heating and sintering a raw material mixed product obtained by a carbonizing process. In the sintering process, sintering is performed at a temperature for maintaining the state of the metal silicon within the raw material mixed product, that is, at the melting point of the metal silicon (1410° C.) or less. In this way, it is possible to obtain a silicon carbide powder having a particle diameter whereby the particle diameter of the metal silicon source is maintained. The heating temperature is preferred to be 1300° C. or more and 1400° C. or less. In addition, if the heating temperature is less than 1300° C., non-reacted metal silicon easily remains which is not desirable.

Because the silicon carbide powder in the producing method of the present invention is obtained via a silicon carbide reaction due to a solid-phase-solid-phase reaction, the reaction rate is slow and the maximum heating temperature is preferred to be in a range of 4 hours or more and 30 hours or less that non-reactive objects do not exist.

The silicon carbide powder to be obtained is a powder in which nano to sub-micron sized primary particles are sintered and secondary particles becomes a powder where the particle form of the metal silicon which is the raw material is maintained. That is, it is possible to control the particle diameter of the silicon carbide powder obtained from the particle diameter of the raw material metal silicon.

In order to grow the primary particles of the obtained silicon carbide powder, heating is performed at a higher temperature than the silicon carbide formation temperature and maintained at this temperature as a post process. The heating temperature is preferred to be 1800° C. or more and 2300° C. or less and more preferably 1900° C. or more and 2100° C. or less. If the heating temperature is less than 1800° C. or less, particle growth is insufficient and if the heating temperature exceeds 2300° C., sublimation of the produced silicon carbide begins which is not desirable.

The heating time in the post process is preferred to be in a range where the primary particles of the obtained silicon carbide powder are sufficiently grown and is preferred to be in range of 1 hour or more and 10 hours or less and maintained at a maximum temperature.

In the producing method of the present invention, if the hearing conditions described above are satisfied then there is no particular imitation to the producing device and method of continuous producing. That is, heating and sintering in the silicon carbide production process and the heating in the post process may be performed continuously while controlling the heating conditions in one heating furnace.

By performing a separation process of the obtained silicon carbide powder using a sieve for example, a silicon carbide powder with an average particle diameter of 100 μm or more and 700 μm or less is obtained.

A silicon carbide single crustal can be obtained from the silicon carbide powder of the present invention using a Modified Lely Method. In the Modified Lely Method, a seed crystal is placed on a part of a lid of a graphite container, the silicon carbide powder of the present invention is filled into the graphite container and a single crystal is grown by a sublimation recrystallization method.

EXAMPLES

Examples of the present invention are explained below. In addition, in the present examples, produce of a silicon carbide single crystal was attempted using a Modified Lely Method in order to confirm the effects of the silicon carbide powder of the present invention.
Creation of Silicon Carbide Powder
(Sintered Powder Crushing Method)

Example 1

The silicon carbide powder which is a raw material used the following synthesized product.

Metal silicon (silicon sludge, average particle diameter 1.0 μm, purity 5N produced by Toshiba LSI) and acetylene black (denka black, average particle diameter 0.04 μm, produced by Denki Kagaku Kogyo) were weighed to produce a mol ratio (C/Si) of 1.0 between the raw materials silicon and carbon, and the raw material powder was adjusted after mixing using a mortar in ethyl alcohol and dried. The raw material powder was put into a graphite crucible, and the silicon carbide powder was obtained by heating in a carbon heater under an argon atmosphere at a temperature of 1900° C. for 2 hours. The obtained silicon carbide powder was crystal phase analyzed using an X-ray diffractometer (MXP-3 produced by Mac Science) and the powder was a β type (3C phase) silicon carbide.

In addition, a particle diameter distribution measurement was performed using laser diffraction, scattering method using a particle size distribution measurement device (LS-230 produced by Beckman Coulter). Adjustment of the particle diameter distribution measurement sample was performed according to the measurement conditions of silicon nitride in table 1 of the attached explanation JIS R 1629-1997 as a general rule and the refraction index was 2.6. As a result the average particle diameter was 6.0 μm.

Next, the obtained silicon carbide powder is filled into a graphite mold with an interior diameter of 50 mm and after preforming, a silicon carbide sintered body was created by heating at 2200° C. for 2 hours under a pressure of 20 MPa in an argon atmosphere using a high frequency induction heating type hot press device. The density of the obtained sintered body was measured using a dimensions, mass measurement and was measured at 2.02 g/cm$^3$ (absolute density 62.7%).

The created silicon carbide sintered body was crushed at a rotation rate of 2400 rpm using a micro-bantam mill (AP-B, produced by Hosokawamicron). The crushed powder was separated using a sieve with gaps of 300 μm and 500 μm. As a result of separation, the yield of powder between 300 μm or more and 500 μm or less was 82%. Furthermore, the separated powder was heated at 60° C. in a mixed acid of hydrofluoric acid, nitric acid and distilled water with a volume ratio of 1:1:1.

After thermolysis was performed on the obtained powder using a mixed acid of hydrofluoric acid, nitric acid and vitriolic acid, an impurity analysis was performed using an ICP light emitting analyzer (CIROS-120 produced by SPECTRO) and the contained amount of each impurity (Li, B, Na, Mg, Al, P, K, Ca, Ti, V, Cr, Mn, Fe, Co, Ni, Cu, Zn, Zr, Mo, Pd, Cd, Sb, Ba, W) was 1 ppm or less.

Particle size distribution was measure using a laser diffraction, scattering method using a particle size distribution measurement device and the average particle size was 449.7 μm.

Next, an SEM image observation of the powder was performed using a scanning electron microscope (SEM JSM-6390 produced by Nihon Denshi). The particle diameter of primary particles which were measured from the SEM image was 20 μm or more and 180 μm or less.

The specific surface area was measured using a constant volume type gas adsorption method using a specific surface area measurement device (NOVA3000e produced by Sysmex) and calculated using a BET multi-point method. Furthermore, the measurement sample was aerated at 200° C. for 3 hours in an N$_2$ flow atmosphere in advance. The specific surface area of the silicon carbide powder of the Example obtained in this way was 0.15 m$^2$/g. The properties of the powder are shown in FIG. 1.

Example 2

Silicon carbide powder (15H2, average particle diameter 0.5 μm produced by Pacific Rundum Co., Ltd) was filled into a graphite mold and after preforming, a silicon carbide sintered body was obtained by heating under an argon atmosphere at a temperature of 2000° C. for 2 hours at a pressure of 30 MPa using a high frequency induction heating type hot press device. The density of the obtained sintered body was measured using a dimensions, mass measurement and was measured at 1.95 g/cm$^3$ (absolute density 60.5%). A similar process as in Example 1 was performed on the created silicon carbide sintered body to obtain a silicon carbide powder. The obtained powder characteristics are shown in FIG. 1 the same as Example 1.

Example 3

Silicon carbide powder (T-1, average particle diameter 0.03 μm produced by Sumitomo Osaka Cement) was filled into a 50 mm interior diameter graphite mold and after preforming, a silicon carbide sintered body was obtained by heating under an argon atmosphere at a temperature of 2200° C. for 2 hours at a pressure of 20 MPa using a high frequency induction heating type hot press device. The density of the obtained sintered body was measured using a dimensions, mass measurement and was measured at 1.37 g/cm$^3$ (absolute density 42.4%). A similar process as in Example 1 was performed on the created silicon carbide sintered body to obtain a silicon carbide powder. The obtained powder characteristics are shown in FIG. 1 the same as Example 1.

Example 4, Comparative Examples 1~3

Example 4 and Comparative Examples 1~3 were performed using the same method as Example 1. Each condition of the samples, sintering conditions, sintering characteristics and powder characteristics are shown in FIG. 1 the same as in Example 1.

Comparative Examples 4

Apart from adding 0.5% by mass of boron carbide (HD20 average particle size 0.5 μm produced by H.C. Starck) as a sintered auxiliary agent, the same processes were performed as in Example 2. The results are shown in FIG. 1 the same as Example 1. The specific surface area of the silicon carbide powder after crushing was below a measurement minimum. (measurement minimum 0.01 m$^2$/g) In addition, 3400 ppm of boron was included as a result of an impurity analysis using an ICP light emitting analyzer.

As is clear from FIG. 1, the silicon carbide powder in Examples 1~4 obtained by the method of the present invention has a sufficient average particle diameter and specific surface area and few contained impurities. However, the sintered body created according to the conditions in Examples 3 and 4 had low strength and the yield of the obtained silicon carbide powder was low. On the other hand, a sintered body could not be created in Comparative Examples 1~3 and impurities were contained in Comparative Example 4.
(Nucleus Addition Method)

Example 5

1. Synthesis of a Raw Material Silicon Carbide

Metal silicon and acetylene black were weighed to produce a mol ratio (C/Si) of elements of 1.0 between silicon and carbon, and the raw material powder (raw material powder A) was adjusted after mixing using a mortar in ethyl alcohol and dried. The raw material powder A was put into a graphite crucible, and the silicon carbide powder a was obtained by heating in a carbon heater under an argon atmosphere at a temperature of 2000° C. for 2 hours. The average particle diameter of the obtained silicon carbide powder a was 17.5 μm. Furthermore, 10% by mass of the raw material silicon carbide powder was added to the raw material powder A, heating and sintering were performed by the process described above and a raw material silicon carbide b was obtained. The average particle diameter of the obtained raw material silicon carbide b was 44.8 μm.

2. Synthesis of Silicon Carbide Powder

Next, 10% by mass of the raw material silicon carbide b was added with respect to the raw material powder A with a C/Si ratio of 1.0, and the raw material powder (raw material powder B) was adjusted after mixing using a mortar in ethyl alcohol and dried. The raw material B was inserted into a graphite crucible and silicon carbide powder was obtained by heating in a carbon heater under an argon atmosphere at a temperature of 2000° C. for 8 hours.

The obtained silicon carbide powder was separated by passing through a sieve with 125 μm gaps. The yield at 125 μm or more was 88%.

The average particle diameter of the obtained silicon carbide powder was 163.2 μm and the specific surface area was 0.26 m$^2$/g. In addition, an SEM image observation was performed and the particle diameter of primary particles which were measured from the SEM image was 10 μm or more and 40 μm or less. Furthermore, as a result of a crystal phase analysis, all of the silicon carbides were β types (3C phase) and an impurity analysis was performed using an ICP light emitting analyzer and the contained amount of each impurity was 1 ppm or less.

Examples 6~8, Comparative Examples 5~8

1. Synthesis of Raw Material Silicon Carbide

A raw material silicon carbide powder added in Examples 6~8 and Comparative Examples 5~8 was obtained by repeating the processes by the same method as in Example 5 a plurality of times. The heating temperature, the number of times each process was repeated and characteristics of the raw material silicon carbide powder are shown in FIG. 2.

2. Synthesis of Silicon Carbide Powder

Apart from the average particle size and added amounts of the raw material silicon carbide powder added shown in FIG. 2, the powder was created by the same method as in Example 5. The heating temperature and characteristics of the obtained silicon carbide powder are shown in FIG. 2.

As is clear from FIG. 2, the silicon carbide powder in Examples 5~8 obtained by the method of the present invention has a sufficient average particle diameter and specific surface area. However, in Example 8, it was clear that the powder characteristics did not show large effects compared to the added raw material silicon carbide powder. However, the silicon carbide powder in Comparative Examples 5~8 had a small particle diameter.
(Solid-Phase Reaction Method)

Example 9

45% by mass of a metal silicon (purity 5N produced by Kojundo Chemical Co) with an average particle diameter of 308.2 μm and 55% by mass of a resol type phenol resin (J-325 produced by DIC) were mixed in ethyl alcohol and after removing the solvent a raw material mixed product was obtained by heat curing at 130° C. This was carbonized by heating for 1 hour at 1000° C. under an argon atmosphere. The obtained carbide raw material mixed product was analyzed for elements using an Igniting—IR method (IR-412 Produced by LECO) and a dehydration weight ICP light emission analysis combined method (CIROS-120, compliant to JIS 1616 produced by SPECTRO) and the C/Si was 1.12.

The obtained carbide raw material mixed product was put into a graphite crucible and a silicon carbide powder was obtained by heating for 10 hours at 1400° C. under an argon atmosphere. As a result of a crystal phase analysis of the obtained silicon carbide, there was no non-reacted silicon or carbon and only β type (3C phase) silicon carbon. In addition, the average particle diameter was 289.4 μm.

Furthermore, the obtained silicon carbide powder was put into a graphite crucible and heated for 2 hours at 2000° C. under an argon atmosphere in a carbon heater furnace. The average particle diameter of the heated powder was 284.1 μm and the specific surface area was 0.21 $m^2/g$. In addition, an SEM image observation was performed and the particle diameter of primary particles which were measured from the SEM image was 8 μm or more and 50 μm or less. Furthermore, an impurity analysis was performed using an ICP light emitting analyzer and the contained amount of each impurity was 1 ppm or less.

Example 10, Comparative Examples 9~13

Example 10 and Comparative Examples 9~13 were performed using the same method as Example 9. Each condition of the raw material in the sintering process of the silicon carbide, sintering conditions and post process sintering conditions and characteristics of the obtained silicon carbide powder are shown in FIG. 3.

Comparative Examples 14

Apart from using carbon black as the carbon source, the powder was created using the same method as Example 9. The characteristics of the obtained silicon carbide powder are shown in FIG. 3.

As is clear from FIG. 3, the silicon carbide powder in Examples 9 and 10 obtained by the method of the present invention has a sufficient average particle diameter and specific surface area. However, in the Comparative Examples 9, 12 and 14, the average particle diameter of the silicon carbide powder after the silicon carbide sintering process was small and the particle was also insufficient after post processing. In addition, in Comparative Example 13, the primary particle diameter was small and sintering between particles was weak making the powder easy to fall apart. In Comparative Example 10, it was clear that non-reacted silicon remained and in Comparative Example 11 silicon carbide was not produced.

Creation of Silicon Carbon Single Crystal

Example 11

5 g of the silicon carbide powder created in Example 1 was filled into a graphite crucible with an 11 inch interior diameter. Next, a 4H—SiC (0001) single crystal plate was placed on a lid section as a seed crystal. The graphite crucible was placed into a high frequency induction heating heater and after sufficiently performing argon replacement, a single crystal was cultivated with an atmosphere pressure of 10 Torr and the bottom surface temperature of the crucible container set at 2000° C. The sublimation rate after 2 hours of growth and after 20 hours of growth and length of the single crystal after 20 hours of growth are shown in FIG. 4. Here, the sublimation rate is a value calculated by dividing the reduced amount (sublimation amount) of the raw material silicon carbide powder after heating by the growth time period.

Comparative Example 15

A single crystal was grown using the same method as in Example 11 using a commercially available high grade purity silicon carbide powder (GMF-CVD produced by Pacific Rundum Co., Ltd). The average particle diameter of the raw material silicon carbide was 682.9 μm and the specific surface area was below a minimum measurement. (below 0.01 $m^2/g$) The results are shown in FIG. 4 the same as Example 11.

Comparative Example 16

A single crystal was grown using the same method as in Example 11 using a commercially available polishing silicon carbide powder (NC-F8 produced by Pacific Rundum Co., Ltd). The average particle diameter of the raw material silicon carbide was 2350 μm and the specific surface area was below a minimum measurement. (below 0.01 $m^2/g$) The results are shown in FIG. 4 the same as Example 11.

Comparative Example 17

A single crystal was grown using the same method as in Example 11 using a high grade purity silicon carbide powder (15H2 produced by Pacific Rundum Co., Ltd). The average particle diameter of the raw material silicon carbide was 0.5 μm and the specific surface area was 16.1 $m^2/g$. The results are shown in FIG. 4 the same as Example 11.

Examples 12~16, Comparative Examples 18~20

A single crystal was grown using the same method as in Example 11 using the silicon carbide powder created in the Examples 2, 5, 6, 9 and 10, and Comparative Examples 5, 6 and 9. The results of the raw material characteristics and after single crystal growth are shown in FIG. 4 the same as Example 11.

As is clear from FIG. 4, in the Examples 11~16 using the silicon carbide powder in Examples 1, 2, 5, 6, 9 and 10 obtained using the method of the present invention, the raw material silicon carbide was sublimated at a stable rate and a single crystal was grown without a reduction in the sublimation rate over 20 hours compared to a sublimation rate over a growth period of 2 hours. However, in Comparative example 15, although a raw material silicon carbide was sublimated at a stable rate, the raw material sublimation amount was less than the silicon carbide powder created using the method of the present invention. In addition, in Comparative Example 16 which used a raw material silicon carbide with a large particle diameter, the amount of sublimation was small and the single crystal growth was 1 mm or less. In the Comparative Examples 17 which used a raw material silicon carbide with a small particle diameter and the Comparative Examples 18~20 which used the silicon carbide powder in Comparative Examples 5, 6 and 9, it was clear that the sublimation rate decreased after 20 hours of crystal growth.

The silicon carbide powder for the production of a silicon carbide single crystal of the present invention displays a high and stable sublimation rate during single crystal growth.

Industrial Applicability

The silicon carbide powder of the present invention displays a high and stable sublimation rate during a sublimation recrystallization method and can be favorably used as a raw material for a silicon carbide single crystal.

The invention claimed is:

1. A silicon carbide powder for producing a silicon carbide single crystal comprising:
   an average particle diameter of 100 μm or more and 700 μm or less and a specific surface area of 0.05 m²/g or more and 0.30 m²/g or less,
   wherein the silicon carbide powder has a particle state in which primary particles having an average particle diameter of 5 μm or more and 200 μm or less are sintered.

2. A method for producing a silicon carbide powder for the production of the silicon carbide single crystal according to claim 1 comprising:
   sintering a silicon carbide powder having an average particle diameter of 20 μm or less under pressure of 70 MPa or less at a temperature of 1900° C. or more and 2400° C. or less and in a non-oxidizing atmosphere, thereby obtaining a sintered body having a density of 1.29 g/cm³ or more;
   adjusting particle size by means of pulverization of the sintered body; and
   removing impurities by means of an acid treatment.

3. A method for producing a silicon carbide powder for the production of a silicon carbide single crystal according to claim 1, wherein the silicon carbide powder is obtained by heating and sintering a raw material mixed product at a temperature of 1800° C. or more and 2300° C. or less under a non-oxidizing atmosphere condition, the raw material mixed product includes a silicon source, a carbon source and 5% by mass or more and 50% by mass or less of a silicon carbide powder with average particle diameter of 20 μm or more.

4. A method for producing a silicon carbide powder for the production of a silicon carbide single crystal according to claim 1, comprising:
   producing the silicon carbide powder by heating and sintering metal silicon and a carbon source with an average particle diameter of 100 μm or more and 700 μm or less under a non-oxidizing atmosphere condition at a temperature of 1300° C. or more and 1400° C. or less; and
   post-processing the silicon carbide powder by heating at a temperature of 1800° C. or more and 2300° C. or less under a non-oxidizing atmosphere condition.

5. The method for producing a silicon carbide powder for the production of a silicon carbide single crystal according to claim 4, wherein the carbon source is an organic compound and the organic compound is carbonized by heating at a temperature of 500° C. or more and 1000° C. or less under a non-oxidizing atmosphere condition before producing the silicon carbide powder by heating and sintering.

* * * * *